United States Patent
Huang

(10) Patent No.: US 11,837,597 B2
(45) Date of Patent: Dec. 5, 2023

(54) SEMICONDUCTOR CAPACITOR ARRAY LAYOUT WITH DUMMY CAPACITOR STRUCTURE

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/677,256

(22) Filed: Feb. 22, 2022

(65) Prior Publication Data

US 2022/0367437 A1 Nov. 17, 2022

(30) Foreign Application Priority Data

May 11, 2021 (TW) .................................. 110116898

(51) Int. Cl.
*H01L 27/01* (2006.01)

(52) U.S. Cl.
CPC .................................... *H01L 27/01* (2013.01)

(58) Field of Classification Search
CPC ................................ H01L 27/01; H01L 28/40
See application file for complete search history.

(56) References Cited

U.S. PATENT DOCUMENTS

| | | |
|---|---|---|
| 10,249,705 B2 | 4/2019 | Lan et al. |
| 10,453,791 B2 | 10/2019 | Fu et al. |
| 2018/0358427 A1* | 12/2018 | Lan .......................... H01L 28/86 |
| 2019/0244894 A1* | 8/2019 | Fu .......................... H03M 1/804 |

FOREIGN PATENT DOCUMENTS

| | | |
|---|---|---|
| CN | 109037211 A | 12/2018 |
| TW | 201935500 A | 9/2019 |

OTHER PUBLICATIONS

OA letter of the counterpart TW application (appl. No. 110116898) dated Sep. 8, 2021, (w/English Summary).

* cited by examiner

*Primary Examiner* — Matthew C Landau
*Assistant Examiner* — Mark Hatzilambrou
(74) *Attorney, Agent, or Firm* — WPAT, P.C.

(57) ABSTRACT

A semiconductor capacitor array layout includes a first conductive structure and a second conductive structure. The first conductive structure includes: longitudinal first conductive strips in a first integrated circuit (IC) layer; and lateral first conductive strips that are in a second IC layer and coupled to the longitudinal first conductive strips. The longitudinal and lateral first conductive strips jointly form well-shaped structures including outer wells and inner wells. The outer wells are not electrically coupled to the inner wells. The second conductive structure includes second conductors that are respectively disposed in the well-shaped structures in the first IC layer. The second conductors include outer second conductors respectively positioned in the outer wells and inner second conductors respectively positioned in the inner wells. The outer second conductor are not electrically coupled to the inner second conductor. The outer wells and the outer second conductors jointly function as a dummy capacitor structure.

11 Claims, 7 Drawing Sheets

SEMICONDUCTOR CAPACITOR ARRAY LAYOUT WITH DUMMY CAPACITOR STRUCTURE

BACKGROUND OF THE INVENTION

1. Field of the Invention

The present disclosure relates to a semiconductor capacitor array layout, especially to a semiconductor capacitor array layout with a dummy capacitor structure.

2. Description of Related Art

A general semiconductor integrated circuit (IC) is in the form of a multilayer structure. A conventional semiconductor capacitor array is usually located in a single metal layer of the multilayer structure. The semiconductor capacitor array usually includes multiple rows of capacitor units that are arranged in parallel and include a first row of capacitor units (hereafter referred to as "first capacitor row") and a second row of capacitor units (hereafter referred to as "second capacitor row"). In order to avoid an upper electrode (lower electrode) of the first capacitor row and the trace of a lower electrode (upper electrode) of the second capacitor row jointly generating parasitic capacitance having influence on the accuracy of capacitance of the capacitor units, the gap between the first capacitor row and the second capacitor row needs to be broaden; however, this wastes circuit area. In regard to the above case, the upper electrode (lower electrode) of the first capacitor row is parallel to the trace of the lower electrode (upper electrode) of the second capacitor row and thereby contributes additional capacitance, and this affects the accuracy of capacitance of the capacitor units.

There are other problems with respect to a conventional semiconductor capacitor array. The design of a capacitor unit of some conventional semiconductor capacitor array is shown in FIG. 1a. In FIG. 1a, the upper electrode 110 is in the form of a U-shaped structure including two longitudinal parts and one lateral part, the lower electrode 120 is in the form of a strip-shaped structure. In comparison with a general mature process, in some advanced process (e.g., Fin Field-Effect Transistor (FinFET) process) the ratio (W/L) of the width "W" of the lateral part of the U-shaped structure to the length "L" of the longitudinal part of the U-shaped structure should be larger as shown in FIG. 1b to conform to the specification of the advanced process. Since a semiconductor capacitor array usually includes a large amount of capacitor units, once the ratio (W/L) of the U-shaped structure of every capacitor unit is enlarged, the overall semiconductor capacitor array will consume a lot of additional circuit area. It should be noted that FIGS. 1a-1b shows the variation in the ratio (W/L) of the U-shaped structure rather than the actual size of the U-shaped structure.

In addition to the above, a semiconductor capacitor array usually includes a plurality of capacitor groups which can be used for the implementation of a capacitive digital-to-analog converter (CDAC). As to a CDAC of an IC manufactured with a process, an advanced process especially, the matching characteristic with respect to the capacitor groups of the CDAC is dependent on the uniformity of the layout density of the capacitor groups and the elements around the capacitor groups. Normally, the better uniformity of the layout density leads to the better matching characteristic. In consideration of the above, in the periphery of the capacitor groups of the CDAC are set dummy capacitors. These dummy capacitors can make the circuit density in the periphery of the layout of the capacitor groups be similar/identical to the circuit density in the interior of the layout of the capacitor groups.

SUMMARY OF THE INVENTION

An object of the present disclosure is to provide a semiconductor capacitor array layout with a dummy capacitor structure to prevent the problems of the prior art.

An embodiment of the semiconductor capacitor array layout of the present disclosure includes a first conductive structure and a second conductive structure. The first conductive structure includes M longitudinal first conductive strips and N lateral first conductive strips, wherein the M is an integer greater than two, and the N is an integer greater than one. The M longitudinal first conductive strips are located in a first integrated circuit (IC) layer; and the N lateral first conductive strips are located in a second IC layer and coupled to the M longitudinal first conductive strips to jointly form $[(M-1) \times (N-1)]$ well-shaped structures. The $[(M-1) \times (N-1)]$ well-shaped structures include (N−1) outer well(s) and $[(M-2) \times (N-1)]$ inner well(s), and the (N−1) outer well(s) are not electrically coupled with the $[(M-2) \times (N-1)]$ inner well(s). The second conductive structure includes $[(M-1) \times (N-1)]$ second conductors. The $[(M-1) \times (N-1)]$ second conductors are located in the first IC layer and respectively positioned in the $[(M-1) \times (N-1)]$ well-shaped structures. The $[(M-1) \times (N-1)]$ second conductors include (N−1) outer second conductor(s) and $[(M-2) \times (N-1)]$ inner second conductor(s). The (N−1) outer second conductor(s) is/are positioned in the (N−1) outer well(s), and the $[(M-2) \times (N-1)]$ inner second conductor(s) is/are positioned in the $[(M-2) \times (N-1)]$ inner well(s). The (N−1) outer second conductor(s) are not electrically coupled with the $[(M-2) \times (N-1)]$ inner second conductor(s). The (N−1) outer well(s) and the (N−1) outer second conductor(s) jointly function as at least a part of the dummy capacitor structure and are in the periphery of the semiconductor capacitor array layout.

Another embodiment of the semiconductor capacitor array layout of the present disclosure includes a first conductive structure and a second conductive structure. The first conductive structure includes M longitudinal first conductive strips and N lateral first conductive strips, wherein the M is an integer greater than one and the N is an integer greater than one. The M longitudinal first conductive strips are located in a first integrated circuit (IC) layer, and the N lateral first conductive strips are located in a second IC layer. Each of the N lateral first conductive strips includes an outer part and an inner part that are discrete and not electrically coupled together, so that the N lateral first conductive strips include N outer parts and N inner parts, wherein the N inner parts are coupled to the M longitudinal first conductive strips through first vias, and the N outer parts are located in the periphery of the semiconductor capacitor array layout and jointly function as at least a part of the dummy capacitor structure. The second conductive structure includes (M−1) longitudinal second conductive strip(s) and (N−1) lateral second conductive strip(s). The (M−1) longitudinal second conductive strip(s) is/are located in the first IC layer, and the (N−1) lateral second conductive strip(s) is/are located in the second IC layer. The (N−1) lateral second conductive strip(s) is/are coupled to the (M−1) longitudinal second conductive strip(s) through second vias. The M longitudinal first conductive strips and the (M−1) longitudinal second conductive strip(s) are alternatively disposed in the first IC layer. The N lateral first conductive strips and the (N−1) lateral second conductive strip(s) are alternative disposed in the second IC layer.

Another embodiment of the semiconductor capacitor array layout of the present disclosure includes a primary capacitor structure and a dummy capacitor structure. The primary capacitor structure includes a first conductive structure and a second conductive structure. The first conductive structure includes longitudinal first conductive strips and lateral first conductive strips, wherein the longitudinal first conductive strips are coupled to the lateral first conductive strips through first vias. The second conductive structure includes longitudinal second conductive strips and lateral second conductive strips, wherein the lateral second conductive strips are coupled to the longitudinal second conductive strips through second vias. The longitudinal first conductive strips and the longitudinal second conductive strips are alternatively disposed in a first IC layer, and the lateral first conductive strips and the lateral second conductive strips are alternatively disposed in a second IC layer. The dummy capacitor structure is located next to at least one outer side of the primary capacitor structure and is in the periphery of the semiconductor capacitor array layout. The dummy capacitor structure includes a third structure and a fourth structure. The third conductive structure includes longitudinal third conductive strips and lateral third conductive strips. The fourth conductive structure includes longitudinal fourth conductive strips and lateral fourth conductive strips. The longitudinal third conductive strips and the longitudinal fourth conductive strips are alternatively disposed in the first IC layer, and the lateral third conductive strips and the lateral fourth conductive strips are alternatively disposed in the second IC layer.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 2b shows a modification of the semiconductor capacitor array layout of FIG. 2a.

FIG. 2c shows another modification of the semiconductor capacitor array layout of FIG. 2a.

DETAILED DESCRIPTION OF THE PREFERRED EMBODIMENTS

The semiconductor capacitor array layout of the present disclosure can mitigate the problem of the prior art about the influence of parasitic capacitance and can prevent the problem caused by the U-shaped structure of the prior art applied in an advanced process.

Figure 2A:
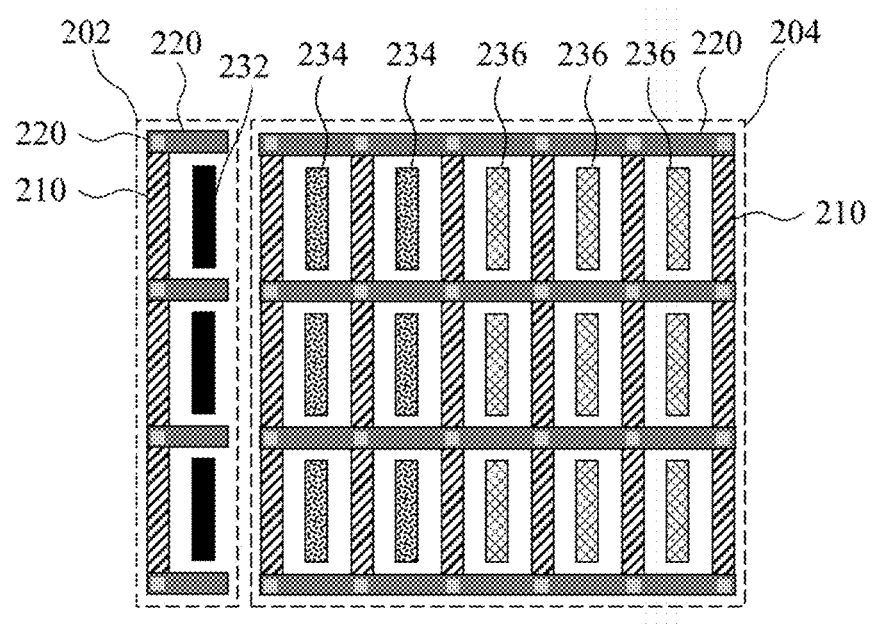
FIG. 2a shows an embodiment of the semiconductor capacitor array layout of the present disclosure.

FIG. 2a shows an embodiment of the semiconductor capacitor array layout of the present disclosure. The semiconductor capacitor array layout 200 of FIG. 2a is included in an integrated circuit (IC) structure (not shown) which includes a substrate and multiple IC layers formed on/above the substrate. The semiconductor capacitor array layout 200 of FIG. 2a includes a first conductive structure and a second conductive structure. The first conductive structure includes M longitudinal first conductive strips 210 (i.e., all the longitudinal strips marked with slashes in FIG. 2a) and N lateral first conductive strips (i.e., all the gray lateral strips in FIG. 2a, each of which includes discrete parts), wherein the M is an integer greater than two, and the N is an integer greater than one. The M longitudinal first conductive strips 210 are located in a first IC layer, and the N lateral first conductive strips 220 are located in a second IC layer and coupled to the M longitudinal first conductive strips 210 to jointly form [(M−1)×(N−1)] well-shaped structures. The [(M−1)×(N−1)] well-shaped structures include (N−1) outer well(s) and [(M−2)×(N−1)] inner well(s). The (N−1) outer well(s) is/are located in a first three-dimensional space including a planar first layout region 202 and the vertical projection space thereof (e.g., the space right above the first layout region 202). The [(M−2)×(N−1)] inner well(s) is/are located in a second three-dimensional space including a planar second layout region 204 and the vertical projection space thereof (e.g., the space right above the second layout region 204). The first layout region 202 and the second layout region 204 are adjacent, but the (N−1) outer well(s) are not electrically coupled with the [(M−2)×(N−1)] inner well(s). It should be noted that in this embodiment the first IC layer and the second IC layer are a first metal and a second metal layer of the aforementioned multiple IC layers respectively and no other metal layer is between the first metal layer and the second metal layer, but the implementation of the present invention is not limited thereto. It should also be noted that vias for coupling the longitudinal first conductive strips 210 with the lateral first conductive strips 220 in the first three-dimensional space can optionally be omitted; in addition, the number of vias for coupling the longitudinal first conductive strips 210 with the lateral first conductive strips 220 in the second three-dimensional space can be determined according to the demand for implementation as long as the purpose of electrical coupling can be fulfilled.

In regard to the embodiment of FIG. 2a, the second conductive structure includes [(M−1)×(N−1)] second conductors (i.e., from the left to the right of FIG. 2a, the black longitudinal strips, the longitudinal strips marked with dots, and the longitudinal strips marked with grids). The shape of each second conductor (e.g., the shape of a single longitudinal/lateral strip, the shape of a combination of longitudinal/lateral strips, the shape of a combination of at least one longitudinal strip and at least one lateral strip, or the shape of a rectangular frame) can be determined according to the demand for implementation. The [(M−1)×(N−1)] second conductors are located in the first IC layer and respectively positioned in the [(M−1)×(N−1)] well-shaped structures. The [(M−1)×(N−1)] second conductors include (N−1) outer second conductor(s) 232 (i.e., all the black longitudinal strips in FIG. 2a) and [(M−2)×(N−1)] inner second conductor(s) 234 and 236 (i.e., all the longitudinal strips 234 marked with dots and all the longitudinal strips 236 marked with grids in FIG. 2a). The (N−1) outer second conductor(s) 232 is/are positioned in the (N−1) outer well(s). The [(M−2)×(N−1)] inner second conductor(s) 234 and 236 is/are positioned in the [(M−2)×(N−1)] inner well(s). Each inner second conductor 234/236 is electrically insulated from its surrounding inner well by dielectric (not shown in the figures) such as oxide. The (N−1) outer well(s) and the (N−1) outer second conductor(s) 232 jointly function as at least a part of the dummy capacitor structure which is in the periphery of the semiconductor capacitor array layout 200 to improve the uniformity of the layout density of the semiconductor capacitor array layout 200.

Figure 2B:
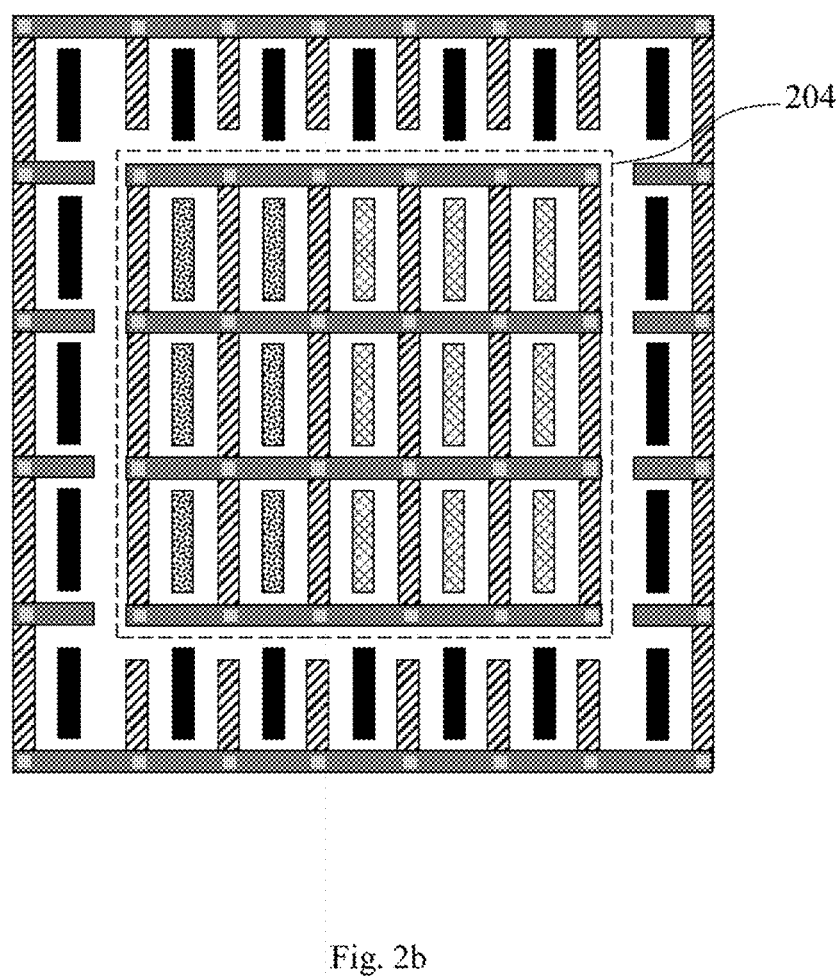
Figure 2C:
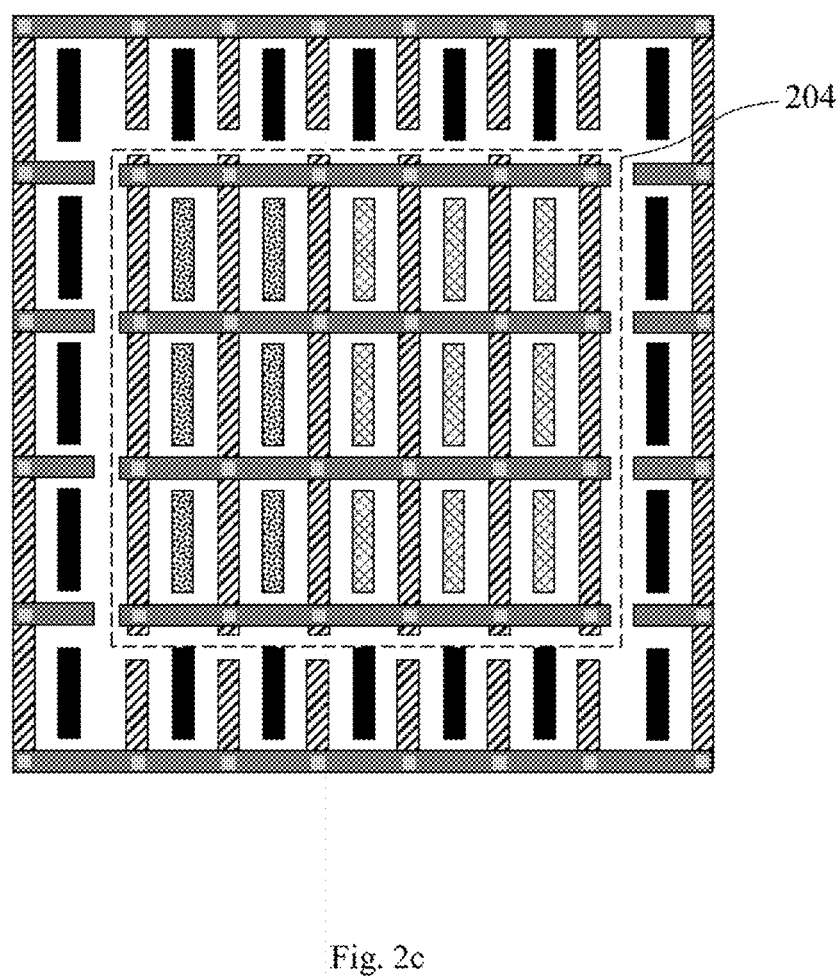

It should be noted that the semiconductor capacitor array layout 200 can further include other outer wells and the second conductors therein which jointly function as other parts of the dummy capacitor structure. The other outer wells are also in the periphery of the semiconductor capacitor array layout 200. For example, the outer wells can be disposed in the four sides next to the second layout region 204 of FIG. 2a to surround the second layout region 204 on which the [(M−2)×(N−1)] inner wells are located as illustrated with FIG. 2b. Besides, the outline of the [(M−2)×(N−1)] inner wells as a whole can be in the shape of a rectangle or a polygon. Since people having ordinary skill in the art can derive the implementation and modification of the above features from the present disclosure, repeated and redundant description is omitted here. In addition, in order to achieve the reliability of electrical coupling or satisfy other demands for implementation, the longitudinal first conductive strips and the lateral first conductive strips in the periphery of the second layout region 204 can be extended outward as shown in FIG. 2c.

In regard to the embodiment of FIG. 2a, the [(M−2)×(N−1)] inner well(s) in the second layout region 204 is/are used for the transmission of a first voltage, the [(M−2)×(N−1)] inner second conductor(s) 234 and 236 in the [(M−2)×(N−1)] inner well(s) is/are used for the transmission of a second voltage, the second voltage is different from the first voltage, and one inner well and the conductor therein jointly form one capacitor unit. The [(M−2)×(N−1)] inner second conductor(s) 234 and 236 include(s) K second conductor(s) 234 (i.e., the longitudinal strips 234 marked with dots in FIG. 2a), wherein the K second conductor(s) 234 and its/their surrounding inner well(s) pertain to K capacitor unit(s) of a first capacitor group among P capacitor group(s) of the semiconductor capacitor array layout 200, the P is a positive integer, and the K is a positive integer not greater than [(M−2)×(N−1)]. In brief, all the capacitor units pertaining to the same capacitor group can be treated as a larger capacitor. People having ordinary skill in the art can derive an embodiment having P capacitor groups composed of two or more capacitor groups from the present disclosure. For example, providing the [(M−2)×(N−1)] is greater than one, the P is greater than one, the K is a positive integer not greater than {[(M−2)×(N−1)]−1}, the [(M−2)×(N−1)] inner second conductor(s) 234 and 236 further include(s) L second conductor(s) 236 (i.e., the longitudinal strips marked with grids in FIG. 2a), the L second conductor(s) 236 and its/their surrounding inner well(s) pertain to L capacitor unit(s) of a second capacitor group among the P capacitor groups, and the L is a positive integer not greater than {[(M−2)×(N−1)]−K}.

It should be noted that the semiconductor capacitor array layout 200 may further include a plurality of capacitor-group power supply strips (not shown in the figures) according to the demand for implementation. The capacitor-group power supply strips are located in the second IC layer, the first IC layer, or a third IC layer (e.g., a metal layer) and function as a voltage transmission path for the [(M−2)×(N−1)] inner second conductor(s) 234 and 236. For example, the capacitor-group power supply strips include a first capacitor-group power supply strip and a second capacitor-group power supply strip, wherein the first capacitor-group power supply strip is coupled with the aforementioned K second conductor(s) 234, and the second capacitor-group power supply strip is coupled to the aforementioned L second conductor(s) 236. Since the way to couple a power supply strip with one or more conductors is common in this technical field, the detail is omitted here. In addition, the (N−1) outer second conductor(s) 232 can be electrically coupled together, and/or the (N−1) outer well(s) and the (N−1) outer second conductor(s) 232 can be electrically coupled together; however, the implementation of the present invention is not limited to the above features.

Figure 1A:
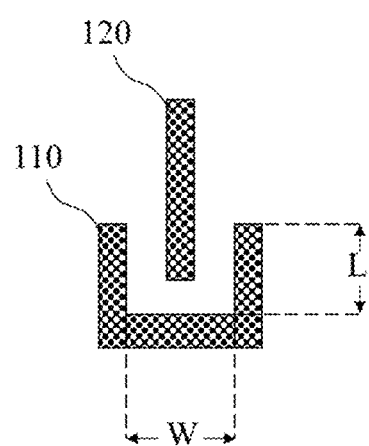
FIG. 1a shows the design of a capacitor unit according to the prior art.
Figure 1B:
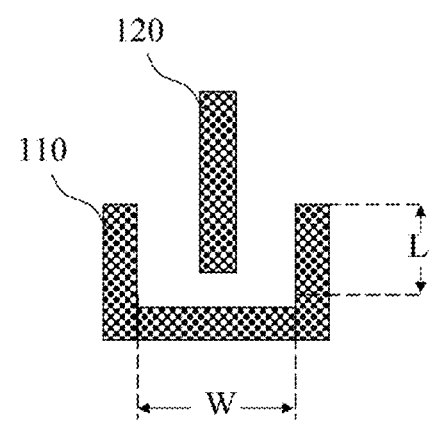
FIG. 1b shows how the design of the capacitor unit in FIG. 1a is modified to conform to the specification of an advanced process.

In regard to the embodiment of FIG. 2a, the conductive strips and the conductors located in the first IC layer in the second layout region 204 can lie in the same direction to conform to the specification of a semiconductor manufacturing process, but the implementation of the present invention is not limited thereto. In an exemplary implementation, all the conductive strips and conductors in the second layout region 204 are in the longitudinal direction, and thus these strips and conductors as a part of the capacitor units of the semiconductor capacitor array layout 200 can be manufactured without wasting circuit area and conform to the specification of an advanced process (e.g., Fin Field-Effect Transistor (FinFET) process). For example, the ratio of the width to the length (W/L) of a U-shaped structure (e.g., the U-shaped structure in FIG. 1b) under the specification of a FinFET process should be larger than the W/L of a U-shaped structure (e.g., the U-shaped structure in FIG. 1a) under the specification of a conventional process, and since the capacitor units in the second layout region 204 in FIG. 2a are not in the form of U-shaped structures, these capacitor units can be manufactured without wasting circuit area.

Figure 3:
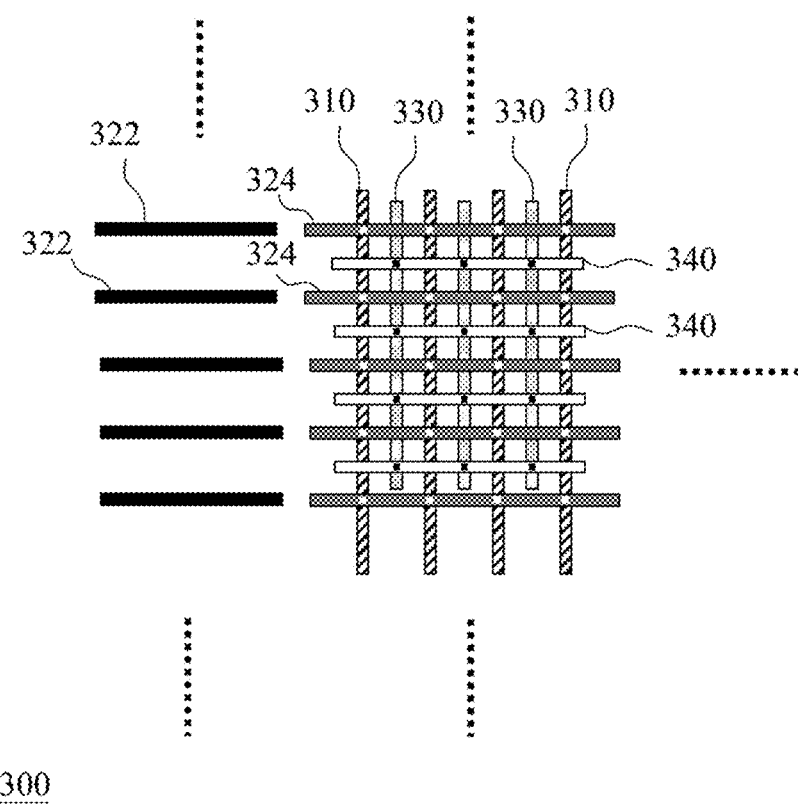
FIG. 3 shows another embodiment of the semiconductor capacitor array layout of the present disclosure.

FIG. 3 shows another embodiment of the semiconductor capacitor array layout of the present disclosure. The semiconductor capacitor array layout 300 of FIG. 3 includes a first conductive structure and a second conductive structure. The first conductive structure includes M longitudinal first conductive strips 310 (i.e., all the longitudinal strips marked with slashes in FIG. 3) and N lateral first conductive strips including discrete parts (i.e., the black lateral strips and the gray lateral strips in FIG. 3). The M longitudinal first conductive strips 310 are located in a first IC layer (e.g., the $X^{th}$ metal layer of the aforementioned multiple IC layers), and the N lateral first conductive strips are located in a second IC layer (e.g., the $(X+1)^{th}$ or $(X-1)^{th}$ metal layer of the aforementioned multiple IC layers). Each of the N lateral first conductive strips includes an outer part 322 (i.e., the black lateral strip in FIG. 3) and an inner part 324 (i.e., the gray lateral strip in FIG. 3) that are disposed in the same line but not electrically coupled together; accordingly, the N lateral first conductive strips include N outer parts 322 and N inner parts 324. The N inner parts 324 are coupled to the M longitudinal first conductive strips 310 through first vias (i.e., the white blocks coupling the gray lateral strip 324 with the longitudinal strip 310 in FIG. 3). The N outer parts 322 are located in the periphery of the semiconductor capacitor array layout 300 and jointly function as at least a part of the dummy capacitor structure so as to improve the uniformity of a layout density of the semiconductor capacitor array layout 300.

In regard to the embodiment of FIG. 3, the second conductive structure includes (M−1) longitudinal second conductive strip(s) 330 (i.e., all the longitudinal strips marked with dots in FIG. 3) and (N−1) lateral second conductive strip(s) 340 (i.e., all the white lateral strips in FIG. 3). The (M−1) longitudinal second conductive strip(s) 330 is/are located in the first IC layer, and the (N−1) lateral second conductive strip(s) 340 is/are located in the second IC layer. The (N−1) lateral second conductive strip(s) 340 is/are coupled to the (M−1) longitudinal second conductive strip(s) 330 through second vias (i.e., the black blocks coupling the white lateral strips with the longitudinal strips marked with dots). The M longitudinal first conductive strips 310 and the (M−1) longitudinal second conductive strip(s) 330 are alternatively disposed in the first IC layer; accordingly, each longitudinal second conductive strip 330 is set between two adjacent longitudinal first conductive strips 310. The N inner parts 324 and the (N−1) lateral second conductive strip(s) 340 are alternative disposed in the second IC layer; accordingly, one lateral second conductive strip 340 is set between two adjacent inner parts 324. In this embodiment, the N inner parts 324 are used for the transmission of a first voltage, and the (N−1) lateral second conductive strip(s) 340 is/are used for the transmission of a second voltage which is different from the first voltage.

Figure 4:
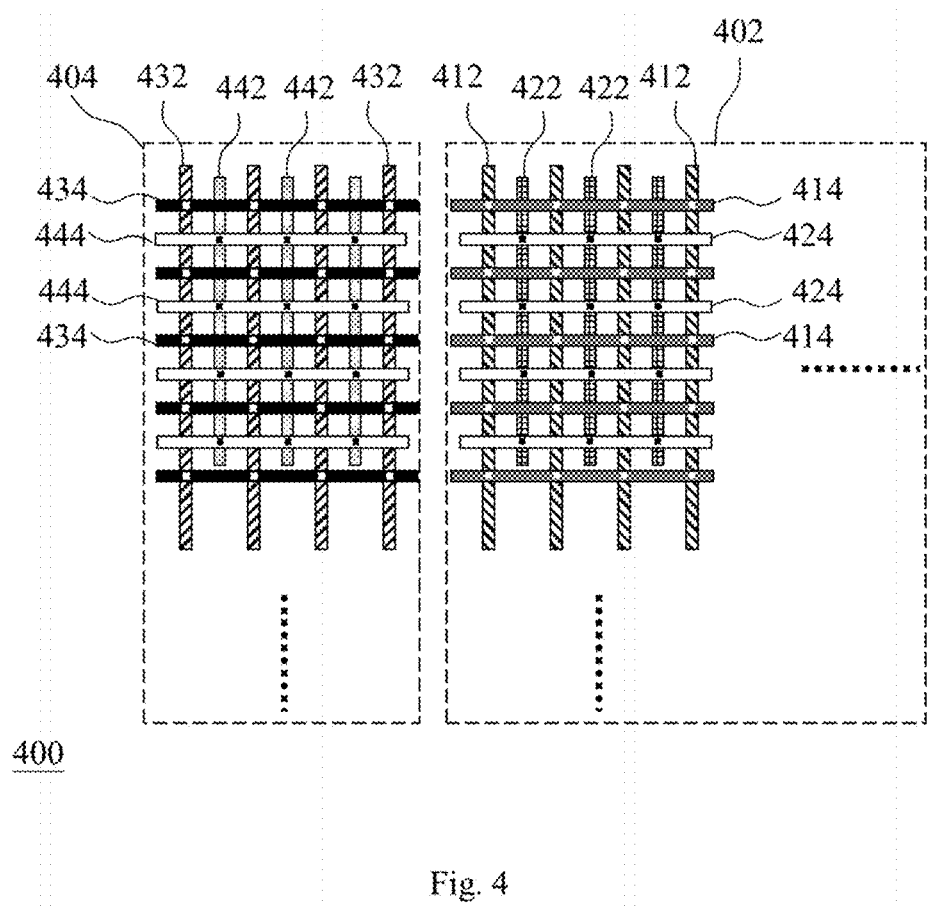
FIG. 4 shows yet another embodiment of the semiconductor capacitor array layout of the present disclosure.

FIG. 4 shows yet another embodiment of the semiconductor capacitor array layout of the present disclosure. The semiconductor capacitor array layout 400 of FIG. 4 includes a primary capacitor structure 402 and a dummy capacitor structure 404. The primary capacitor structure 402 includes a first conductive structure and a second conductive structure. The dummy capacitor structure 404 includes a third structure and a fourth structure.

In regard to the embodiment of FIG. 4, the first conductive structure includes longitudinal first conductive strips 412 (i.e., all the longitudinal strips marked with backslashes of the primary capacitor structure 402 in FIG. 4) and lateral first conductive strips 414 (i.e., all the gray lateral strips of the primary capacitor structure 402 in FIG. 4). The longitudinal first conductive strips 412 are located in a first IC layer (e.g., the $X^{th}$ metal layer of the aforementioned multiple IC layers) and the lateral first conductive strips 414 are located in a second IC layer (e.g., the $(X+1)^{th}$ or $(X−1)^{th}$ metal layer of the aforementioned multiple IC layers). The longitudinal first conductive strips 414 are coupled to the lateral first conductive strips 412 through first vias (i.e., the white blocks of the primary capacitor structure 402 coupling the gray lateral strips with the longitudinal strips marked with backslashes in FIG. 4) and used for the transmission of a first voltage.

In regard to the embodiment of FIG. 4, the second conductive structure includes longitudinal second conductive strips 422 (i.e., all the longitudinal strips marked with grids of the primary capacitor structure 402 in FIG. 4) and lateral second conductive strips 424 (i.e., all the white lateral strips of the primary capacitor structure 402 in FIG. 4). The longitudinal second conductive strips 422 are located in the first IC layer, and the lateral second conductive strips 424 are located in the second IC layer. The lateral second conductive strips 424 are coupled to the longitudinal second conductive strips 422 through second vias (i.e., the black blocks of the primary capacitor structure 402 coupling the white lateral strips with the longitudinal strips marked with grids in FIG. 4) and used for the transmission of a second voltage which is different from the first voltage. The longitudinal first conductive strips 412 and the longitudinal second conductive strips 422 are alternatively disposed in the first IC layer. The lateral first conductive strips 414 and the lateral second conductive strips 424 are alternatively disposed in the second IC layer.

In regard to the embodiment of FIG. 4, the third conductive structure includes longitudinal third conductive strips 432 (i.e., all the longitudinal strips marked with slashes of the dummy capacitor structure 404 in FIG. 4) and lateral third conductive strips 434 (i.e., all the black lateral strips of the dummy capacitor structure 404 in FIG. 4). The lateral third conductive strips 434 can be coupled to the longitudinal third conductive strips 432 through third vias (i.e., the white blocks of the dummy capacitor structure 404 coupling the black lateral strips with the longitudinal strips marked with slashes in FIG. 4), but this is optional according to the demand for implementation. The fourth conductive structure includes longitudinal fourth conductive strips 442 (i.e., all the longitudinal strips marked with dots of the dummy capacitor structure 404 in FIG. 4) and lateral fourth conductive strips 444 (i.e., all the white lateral strips of the dummy capacitor structure 404 in FIG. 4). The lateral fourth conductive strips 444 can be coupled to the longitudinal fourth conductive strips 442 through fourth vias (i.e., the black blocks of the dummy capacitor structure 404 coupling the white lateral strips with the longitudinal strips marked with dots in FIG. 4), but this is optional according to the demand for implementation. The longitudinal third conductive strips 432 and the longitudinal fourth conductive strips 442 are alternatively disposed in the first IC layer, and the lateral third conductive strips 434 and the lateral fourth conductive strips 444 are alternatively disposed in the second IC layer.

In regard to the embodiment of FIG. 4, the primary capacitor structure 402 and the dummy capacitor structure 404 are not electrically coupled together. The dummy capacitor structure 404 is in the periphery of the semiconductor capacitor array layout 400 to improve the uniformity of the layout density of the semiconductor capacitor array layout 400; for example, the dummy capacitor structure 404 is next to at least one side of the primary capacitor structure 402 in the periphery of the semiconductor capacitor array layout 400. In addition, the longitudinal first conductive strips 412, the longitudinal second conductive strips 422, the lateral first conductive strips 414, and the lateral second conductive strips 424 jointly form an effective capacitor unit. In this embodiment the effective capacitor unit is the minimum capacitor unit of the semiconductor capacitor array layout 400, but the implementation of the present invention is not limited thereto. The longitudinal third conductive strips 432, the longitudinal fourth conductive strips 442, the lateral third conductive strips 434, and the lateral fourth conductive strips 444 jointly form a dummy capacitor unit. In this embodiment the dummy capacitor unit and the voltage thereon as a whole will not function as a capacitor, but the implementation of the present invention is not limited thereto. The third conductive structure can be electrically coupled with the fourth conductive structures, if necessary.

It should be noted that the primary capacitor structure 402 can include more effective capacitor units and the dummy capacitor structure 404 can include more dummy capacitor units as illustrated with the ellipses of FIG. 4 which are used for the prevention of a complicated drawing. Since people having ordinary skill in the art can refer to the present disclosure to appreciate the implementation of other effective capacitor units and dummy capacitor units, repeated and redundant description is omitted here. In FIG. 4, the conductive strips of all the effective capacitor units for the transmission of the first voltage are electrically coupled together; the conductive strips of all the effective capacitor units for the transmission of the second voltage are electrically coupled together when these conductive strips pertain to the same capacitor group. The capacitor units as a whole pertaining to the same capacitor group can be treated as a larger capacitor.

It should be noted that the size (i.e., the length, width, and thickness) of the strip-shaped conductor (e.g., conductive strip or power supply strip) mentioned in the present specification is not limited to specific specifications and can be determined according to the demand for implementation. It should also be noted that people having ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the semiconductor capacitor array layout of the present disclosure can mitigate the problem of the prior art about the influence of parasitic capacitance and can prevent the problem caused by the U-shaped structure of the prior art applied in an advanced process.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A semiconductor capacitor array layout with a dummy capacitor structure, the semiconductor capacitor array layout comprising:
   a first conductive structure including:
      M longitudinal first conductive strips located in a first integrated circuit (IC) layer, wherein the M is an integer greater than two; and
      N lateral first conductive strips located in a second IC layer and coupled to the M longitudinal first conductive strips to jointly form $[(M-1)\times(N-1)]$ well-shaped structures, wherein the $[(M-1)\times(N-1)]$ well-shaped structures include (N−1) outer well(s) and $[(M-2)\times(N-1)]$ inner well(s), the (N−1) outer well(s) is/are not electrically coupled with the $[(M-2)\times(N-1)]$ inner well(s), and the N is an integer greater than one;
   a second conductive structure including:
      $[(M-1)\times(N-1)]$ second conductors located in the first IC layer and respectively positioned in the $[(M-1)\times(N-1)]$ well-shaped structures, wherein the $[(M-1)\times(N-1)]$ second conductors include (N−1) outer second conductor(s) and $[(M-2)\times(N-1)]$ inner second conductor(s), the (N−1) outer second conductor(s) is/are positioned in the (N−1) outer well(s), the $[(M-2)\times(N-1)]$ inner second conductor(s) is/are positioned in the $[(M-2)\times(N-1)]$ inner well(s), and the (N−1) outer second conductor(s) is/are not electrically coupled with the $[(M-2)\times(N-1)]$ inner second conductor(s),
   wherein the (N−1) outer well(s) and the (N−1) outer second conductor(s) jointly function as at least a part of the dummy capacitor structure, and each of the $[(M-2)\times(N-1)]$ inner well(s) includes four sides composed of two of the M longitudinal first conductive strips and two of the N lateral first conductive strips and thereby surrounds one of the $[(M-2)\times(N-1)]$ inner second conductor(s).

2. The semiconductor capacitor array layout of claim 1, wherein the $[(M-2)\times(N-1)]$ inner well(s) is/are used for transmission of a first voltage, the $[(M-2)\times(N-1)]$ inner second conductor(s) is/are used for transmission of a second voltage that is different from the first voltage, the $[(M-2)\times(N-1)]$ inner second conductor(s) include(s) K second conductor(s) pertaining to a first capacitor group among P capacitor group(s) of the semiconductor capacitor array layout, the P is a positive integer, and the K is a positive integer not greater than $[(M-2)\times(N-1)]$.

3. The semiconductor capacitor array layout of claim 2, wherein the $[(M-2)\times(N-1)]$ is greater than one, the P is greater than one, the K is the positive integer not greater than $\{[(M-2)\times(N-1)]-1\}$, the $[(M-2)\times(N-1)]$ inner second conductor(s) include(s) L second conductor(s) pertaining to a second capacitor group among the P capacitor groups, and the L is a positive integer not greater than $\{[(M-2)\times(N-1)]-K\}$.

4. The semiconductor capacitor array layout of claim 1, wherein the N is greater than two, and the (N−1) outer second conductors are electrically coupled together.

5. The semiconductor capacitor array layout of claim 1, wherein the (N−1) outer well(s) and the (N−1) outer second conductor(s) are electrically coupled together.

6. The semiconductor capacitor array layout of claim 1, wherein both the N lateral first conductive strips and the M longitudinal first conductive strips are directly coupled with vias without using any other conductors, and thus the N lateral first conductive strips and the M longitudinal first conductive strips are electrically coupled through the vias.

7. The semiconductor capacitor array layout of claim 1, wherein at least one of the N lateral first conductive strips is discrete and thus includes an outer portion pertaining to one of the (N−1) outer well(s) and an inner portion pertaining to one of the $[(M-2)\times(N-1)]$ inner well(s), and the outer portion and the inner portion are separate.

8. A semiconductor capacitor array layout with a dummy capacitor structure, the semiconductor capacitor array layout comprising:
   a first conductive structure including:
      M longitudinal first conductive strips located in a first integrated circuit (IC) layer, wherein the M is an integer equal to or greater than four; and
      N lateral first conductive strips located in a second IC layer, wherein the N is an integer equal to or greater than four, the N lateral first conductive strips are coupled to the M longitudinal first conductive strips, the N lateral first conductive strips and the M longitudinal first conductive strips jointly form $[(M-1)\times(N-1)]$ well-shaped structures, the $[(M-1)\times(N-1)]$ well-shaped structures include $[2\times(M+N-4)]$ outer wells and $[(M-3)\times(N-3)]$ inner well(s), the $[2\times(M+N-4)]$ outer wells surround the $[(M-3)\times(N-3)]$ inner well(s), and the $[2\times(M+N-4)]$ outer wells are not electrically coupled with the $[(M-3)\times(N-3)]$ inner well(s); and
   a second conductive structure including:
      $[(M-1)\times(N-1)]$ second conductors located in the first IC layer and respectively positioned in the $[(M-1)\times(N-1)]$ well-shaped structures, wherein the $[(M-1)\times(N-1)]$ second conductors include $[2\times(M+N-4)]$ outer second conductors and $[(M-3)\times(N-3)]$ inner second conductor(s), the $[2\times(M+N-4)]$ outer second conductors are positioned in the $[2\times(M+N-4)]$ outer wells, the $[(M-3)\times(N-3)]$ inner second conductor(s) is/are positioned in the $[(M-3)\times(N-3)]$ inner well(s), and the $[2\times(M+N-4)]$ outer second conductors are not electrically coupled with the $[(M-3)\times(N-3)]$ inner second conductor(s), wherein the [2×(M+N−4)] outer well(s) and the [2×(M+N−4)] outer second conductor(s) jointly function as the dummy capacitor structure.

9. The semiconductor capacitor array layout of claim 8, wherein the [2×(M+N−4)] outer second conductors are electrically coupled together.

10. The semiconductor capacitor array layout of claim 8, wherein the [2×(M+N−4)] outer well(s) and the [2×(M+N−4)] outer second conductor(s) are electrically coupled together.

11. The semiconductor capacitor array layout of claim 8, wherein both the N lateral first conductive strips and the M longitudinal first conductive strips are directly coupled with vias without using any other conductors, and thus the N lateral first conductive strips and the M longitudinal first conductive strips are electrically coupled through the vias.

\* \* \* \* \*